United States Patent [19]
Lovell

[11] Patent Number: 4,648,666

[45] Date of Patent: Mar. 10, 1987

[54] ELECTRICAL CONNECTOR

[75] Inventor: Gregory R. Lovell, Lebanon, Pa.

[73] Assignee: AMP Incorporated, Harrisburg, Pa.

[21] Appl. No.: 751,760

[22] Filed: Jul. 3, 1985

[51] Int. Cl.[4] .............................................. H01R 9/09
[52] U.S. Cl. ........................ 339/17 CF; 174/52 FP; 339/218 M
[58] Field of Search .......... 339/17 CF, 17 M, 17 LM, 339/218 R, 218 M; 174/52 FP; 361/403, 404

[56] References Cited

U.S. PATENT DOCUMENTS

| | | | |
|---|---|---|---|
| 3,026,494 | 3/1962 | Andersen et al. | 339/17 CF |
| 3,391,382 | 7/1968 | Leibovitz | 339/17 CF |
| 4,008,938 | 2/1977 | Anhalt et al. | 339/17 CF |
| 4,376,560 | 3/1983 | Olsson et al. | 339/17 CF |
| 4,502,747 | 3/1985 | Bright et al. | 339/17 CF |
| 4,558,397 | 12/1985 | Olsson | 339/17 CF |

*Primary Examiner*—Neil Abrams
*Attorney, Agent, or Firm*—Allan B. Osborne

[57] ABSTRACT

An electrical connector for electrically and mechanically attaching a leadless chip carrier to a printed circuit board. More particularly the connector includes a dielectric frame member having recess along the outwardly facing sides and contacts, received in the recesses, having contact sections extending above and below the frame member and outwardly therefrom for soldered engagement with respective chip carrier and circuit board. Projections extending outwardly from the recesses are received in holes in the contacts to retain the contacts in the recesses.

4 Claims, 4 Drawing Figures

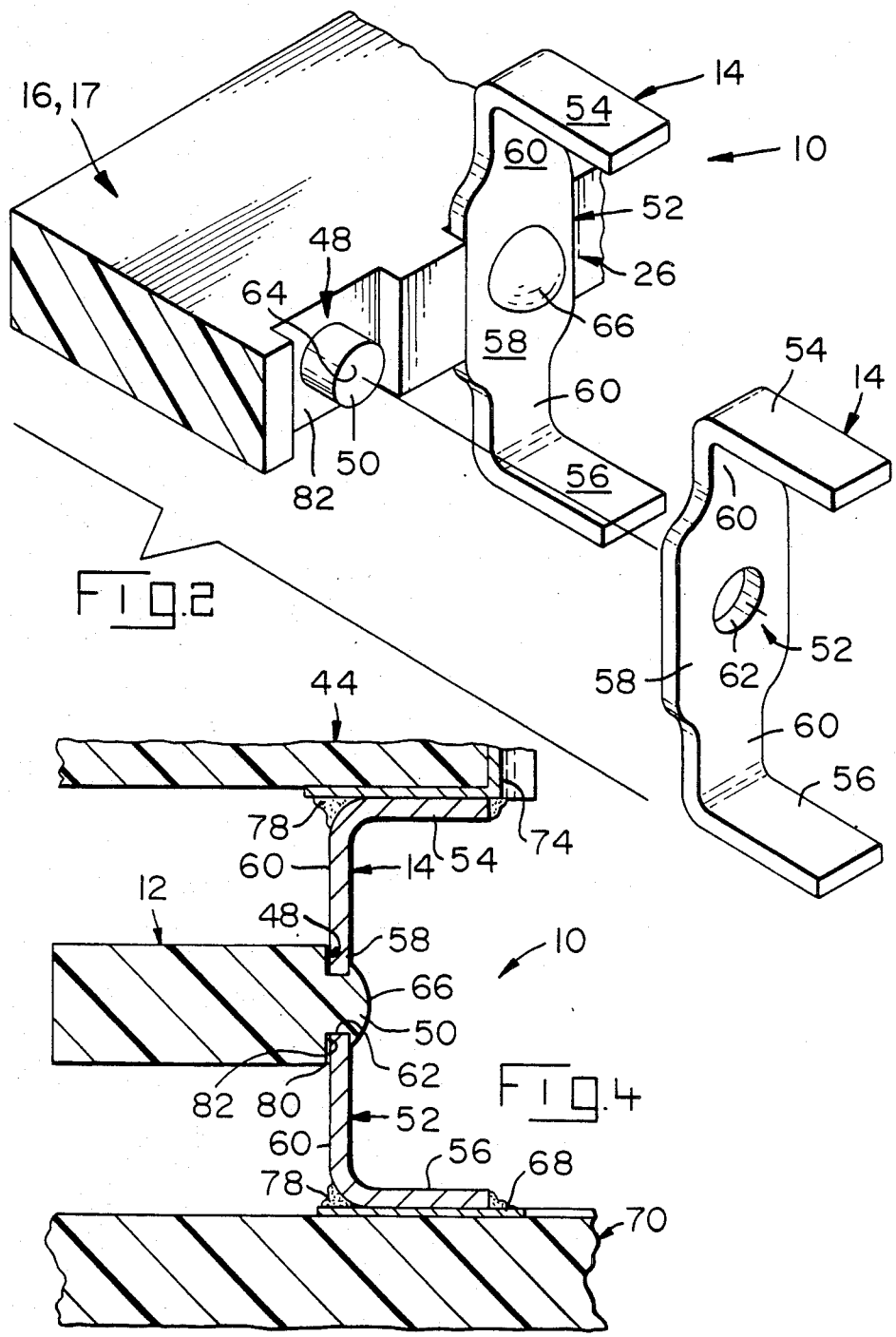

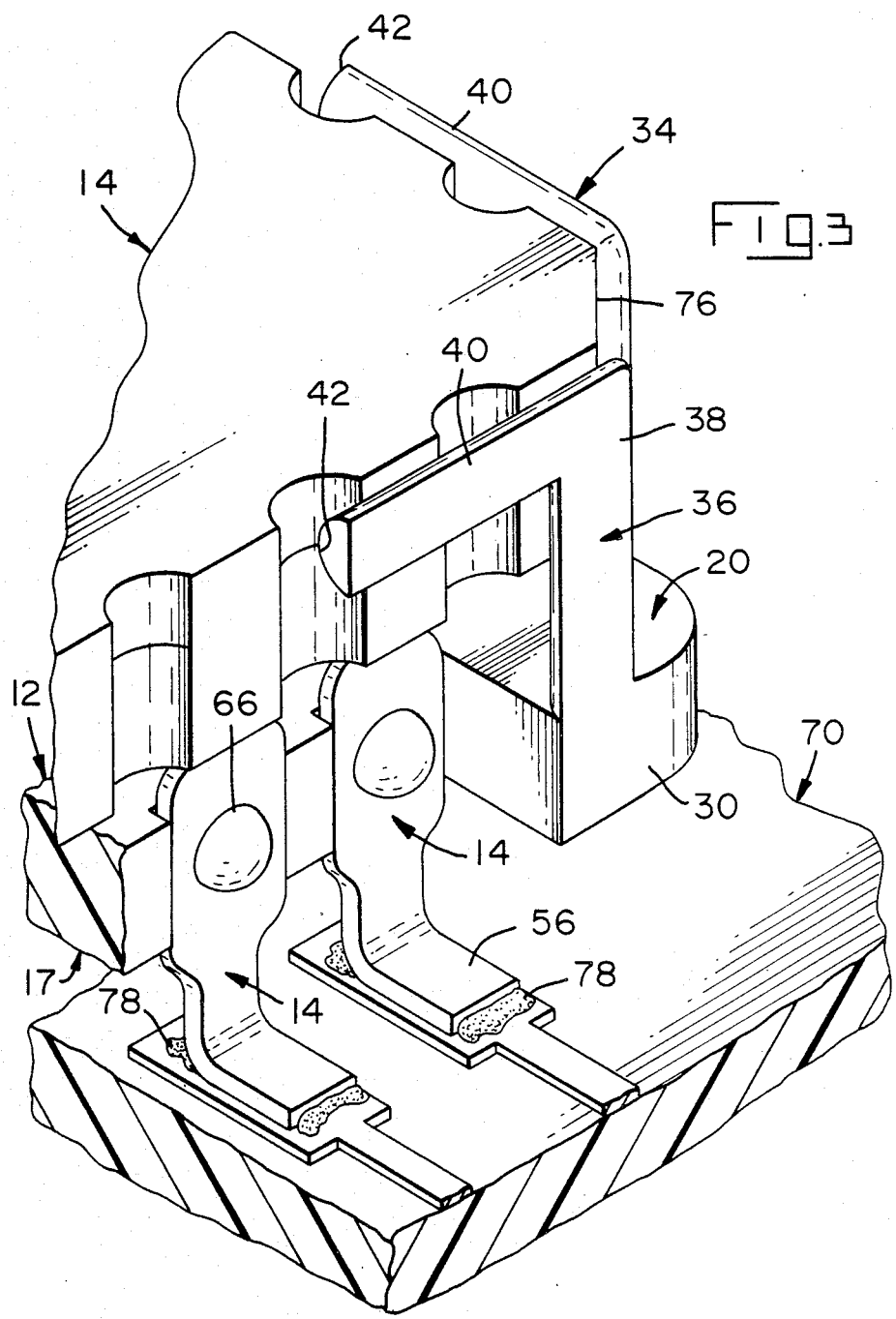

ELECTRICAL CONNECTOR

This invention relates to electrical connectors and more particularly to a connector for surface mounting a leadless chip carrier to a printed circuit board.

U.S. Pat. No. 4,427,249 discloses a connector comprising a housing, a plurality of contact elements and a cover for electrically connecting a leadless chip carrier to a printed circuit board. The contact elements include pins or leads at the lower ends for being received in holes in the circuit board and for being electrically connected to the circuits thereon. Contact surfaces on the upper ends of the contact elements receive pads on the chip carrier. The cover removably biases the chip carrier against the contact surfaces.

A leadless chip carrier may be quickly and easily connected to and disconnected from the circuit board using the above described connector. However, some users, particularly the military, prefer to solder the chip carrier to the board. Chip carriers having depending leads thereon can be directly soldered to the board. Leadless chip carriers, however, require an intervening device. Accordingly, the invention disclosed herein is to an electrical connector having contact sections or solder feet for being soldered to the chip carrier (or other similar electronic component) and other solder feet for being soldered to the board. More particularly the connector includes a support frame of resilient thin walls defining a central opening, and a plurality of contacts attached to the outwardly facing side surface of each wall. The contacts have an elongated vertical section with solder feet at each end projecting away therefrom at right angles relative thereto.

For a better understanding of the invention, reference will now be made by way of example to the accompanying drawings, in which:

FIG. 2 is an enlarged view of a portion of the connector of FIG. 1 showing contact detail and a method of attaching the contacts to the support frame;

FIG. 3 is an enlarged view of a corner of the connector of FIG. 1 showing details of a leadless chip carrier locating means; and FIG. 4 is an enlarged, cross sectional view showing a contact soldered to a leadless chip carrier and a printed circuit board.

Figure 1:
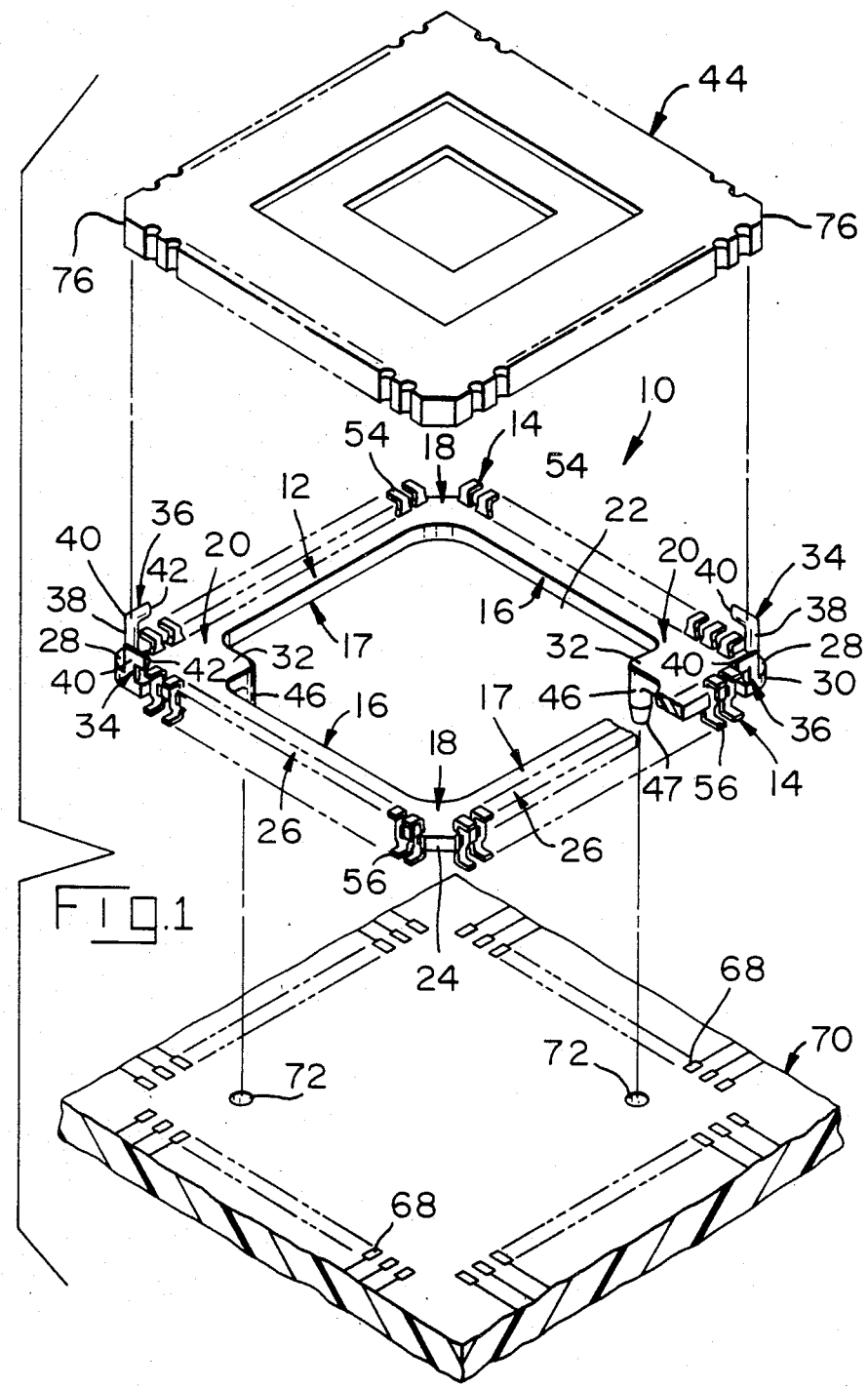
FIG. 1 is an isometric view of an electrical connector constructed in accordance with the preferred embodiment of the present invention.

With reference now to FIG. 1, connector 10, constructed in accordance with the preferred embodiment of the present invention, includes support frame 12 and contacts 14.

Support frame 12 is preferably molded from a resilient polyphenylene sulfide. Other resilient, insulating materials would be as suitable. Two parallel walls 16 and two parallel walls 17 form the support frame 12 by being joined at their ends to form two corners 18, one being diagonally located from the other, two corners 20 located between corners 18 and to define central opening 22. Corners 18 include by an outwardly facing surface 24 which is at a forty-five degree angle relative to adjacent walls 16, 17.

Corners 20 include an outer shelf 28 with a curved outwardly facing surface 30 and an inner shelf 32 projecting into central opening 22. Chip carrier locators 34, 36, preferably molded as an integral part of support frame 12, extend upwardly from outer shelf 28. Locators 34, 36 are L-shaped, having a vertical first leg 38 and a horizontal second leg 40. Second legs 40 on locators 34 are parallel to walls 16 while second legs 40 on locators 36 are parallel to walls 17. Surfaces 42 on locators 34, 36 face in towards central opening 22 and preferably are convex to provide a one point engagement with leadless chip carrier 44.

A cylindrical pin 46 with a tapered free end 47 projects downwardly from inner shelf 32 on each corner 20 and are a molded part of support frame 12.

Outwardly facing side surfaces 26 of walls 16, 17 are identical with a short length of one such surface 26 being shown in larger scale in FIG. 2. With reference to the drawing in FIG. 2, surface 26 includes vertical recesses 48 spaced therealong. A stud 50 projects laterally outwardly from each recess 48.

Contacts 14, shown in large scale also in FIG. 2, are preferably stamped and formed from a fully hardened cupro-nickel material. Each contact 14 includes a vertical elongated section 52 and horizontal upper and lower contact sections, commonly referred to as solder feet 54, 56 respectively.

Section 52 may be subdivided into an intermediate portion 58 and straps 60 located on each end thereof. Straps 60 connect solder feet 54, 56 to and are thinner in width than intermediate portion 58. A hole 62 is provided in the center of elongated section 52.

As shown in FIG. 2, solder feet 54, 56 are formed at right angles to and project from section 52 in the same direction. With continuing reference to FIG. 2, connector 10 is formed by attaching contacts 14 to support frame 12 with solder feet 54, 56 projecting laterally outwardly therefrom. (Contacts 14 could be positioned so that solder feet 54,56 project inwardly.) The intermediate portion 58 of elongated section 52 is placed in recess 48 with stud 50 projecting through hole 62. Heat is applied to fuse free end 64 of stud 50 to form button 66 which stakes contact 14 to support frame 12. FIG. 4 is a cross-sectional view showing the contact 14 so staked.

As shown in FIGS. 1, 2 and 4, straps 60 extend above and below walls 16, 17; i.e., only intermediate portions 58 are substantially within the confines of walls 16, 17.

With reference to FIG. 1, solder paste (not shown) is applied by silk-screening to conductive pads 68 on printed circuit board 70. Connector 10 is placed on the board 70 with proper location being provided by pins 46 on support frame 12 entering holes 72 in board 70. Lower solder feet 56 are thereby correctly positioned on pads 68. Preferably there is an interference fit between pins 46 and holes 72 to securely hold connector 10 on board 70.

With solder paste on conductive pads 74 (FIG. 4) on chip carrier 44, the carrier 44 is placed onto connector 10. Correct alignment or registration between carrier conductive pads 74 and upper solder feet 54 is obtained with carrier corners 76 being non-forcefully received between locators 34,36 on each corner 20 of support frame 12. FIG. 3 shows one carrier corner 76 within or bracketed by locators 34,36 on one corner 20. The assembly is now subjected to vapor phase solder reflowing to electrically and mechanically attach carrier 44 to board 70 via connector 10. The cross-sectional view in FIG. 4 shows the attachment with the reflowed solder joints being indicated by reference numeral 78.

After reflow, the board 70, connector 10 and carrier 44 are easily cleaned given the elongated vertical section 52 of contacts 14 which provides space between carrier 44 and board 70. Further, this space permits ventilation to take place between chip carrier 44 and board 70 to keep chip carrier 44 cool.

With reference to FIG. 4, a compliance gap 80 is observable between surface 82 of the recess 48 and contact 14. Gap 80 may be obtained by placing a removable spacer (not shown) between surface 82 and contact 14 during heat stacking. This gap 80, along with the method of staking contacts 14 to support frame 12 and with straps 60 of reduced width, and further with the resilience of support frame 12, provide an X-Y compliancy well suited to overcome thermal mismatch between carrier 44 and board 70. Further, contacts 14 as structured allow compliance in the Z axis as well.

With solder feet 54, 56 projecting outwardly, probe tests are easily and accurately performed. Further, visual checking of the solder joints 78 can be made accurately.

A connector 10 adapted to receive a sixty-eight position leadless chip carrier 44 is one inch (25.4 mm) square and has an overall height of 0.225 inches (5.715 mm) which includes depending pins 46 and locators 34, 36.

Walls 16–17 of support frame 12 have a thickness of 0.030 inches (0.762 mm). Spacing between adjacent studs 50 is 0.050 inches (1.27 mm). The width of recesses 48 is preferably 0.033 inches (0.8382 mm).

The overall length of contact 14 is 0.100 inches (2.54 mm) and has a thickness of 0.005 inches (0.127 mm). The length and width of the intermediate portion 58 is 0.030 inches (0.762 mm) and 0.032 inches (0.8128 mm) respectively. Straps 60 and solder feet 54, 56 have a width of 0.016 inches (0.4064 mm) and solder feet 54, 56 have a length of 0.040 inches (1.016 mm).

As noted above, the reduced width of straps 60 relative to intermediate portion 58 provides a degree of resiliency therebetween.

Compliance gap 80 is preferably about 0.0005 inches (0.0127 mm) wide.

Connector 10 has been described above as providing an interconnection between leadless chip carrier 44 and circuit board 70. It should be noted, however, that connector 10 may be used with other type leadless electronic components and circuit carrying devices; e.g., leadless pin grid array packages and flexible film (neither shown).

I claim:

1. An electrical connector for surface mounting a leadless chip carrier to a printed circuit board, comprising:
   a dielectric frame member;
   recesses at spaced intervals along the sides of the frame member;
   projections extending outwardly from each of said recesses;
   a plurality of contacts having intermediate sections with each section having a hole therethrough, said contacts being secured along the sides of the frame member with the intermediate sections being disposed in respective recesses with said holes receiving said projections therethrough and said projections being upset to secure said contacts in said recesses;
   first contact sections of said contacts connected to said intermediate section and extending below and outwardly of said frame for soldered electrical connection with respective conductive pads of the printed circuit board; and
   second contact sections of said contacts connected to said intermediate section and extending above and outwardly of said frame for soldered electrical connection with respective conductive pads of the leadless chip carrier.

2. The electrical connector of claim 1 wherein a compliance gap is provided between the recess surface and the intermediate section.

3. The electrical connector of claim 2 further including locator means on said frame member for locating a leadless chip carrier thereon and for registering conductive pads on the chip carrier with respective said second contact sections.

4. The electrical connector of claim 3 wherein said locator means include outwardly extending first leg means positioned on adjacent sides of said frame member at each of two diagonally opposite corners and second leg means attached to each of said first leg means and extending therefrom in a direction parallel to the side of said frame member from which respective said first leg means extend.

* * * * *